United States Patent
Ontalus

(10) Patent No.: US 11,728,380 B2
(45) Date of Patent: Aug. 15, 2023

(54) BIPOLAR TRANSISTOR WITH BASE HORIZONTALLY DISPLACED FROM COLLECTOR

(71) Applicant: GLOBALFOUNDRIES U.S. Inc., Malta, NY (US)

(72) Inventor: Viorel C. Ontalus, Hartford, CT (US)

(73) Assignee: GlobalFoundries U.S. Inc., Malta, NY (US)

( * ) Notice: Subject to any disclaimer, the term of this patent is extended or adjusted under 35 U.S.C. 154(b) by 70 days.

(21) Appl. No.: 17/356,633

(22) Filed: Jun. 24, 2021

(65) Prior Publication Data

US 2022/0416029 A1 Dec. 29, 2022

(51) Int. Cl.
| | | |
|---|---|---|
| *H01L 29/10* | (2006.01) | |
| *H01L 29/732* | (2006.01) | |
| *H01L 29/08* | (2006.01) | |
| *H01L 27/082* | (2006.01) | |

(52) U.S. Cl.
CPC ...... *H01L 29/1004* (2013.01); *H01L 27/0823* (2013.01); *H01L 29/0821* (2013.01); *H01L 29/732* (2013.01)

(58) Field of Classification Search
CPC .......... H01L 27/0823; H01L 27/0623; H01L 27/0262; H01L 27/0263; H01L 27/082–0828; H01L 29/0821; H01L 29/732; H01L 29/1004; H01L 29/063; H01L 29/6656; H01L 29/0649; H01L 29/735; H01L 29/0847; H01L 29/0673; H01L 29/775; H01L 29/66439; H01L 29/78696; H01L 27/0229–0244; H01L 27/102; H01L 27/1022; H01L 27/11801; H01L 27/11896; H01L 27/2445; H01L 29/04; H01L 29/0804–0834; H01L 29/1008; H01L 29/0696; H01L 29/41708; H01L 29/42304; H01L 29/66234–66348; H01L 29/66265; H01L 29/66295–66303; H01L 29/66325; H01L 29/66333–66348; H01L 29/66287; H01L 29/66242; H01L 29/73–7378; H01L 29/737; H01L 29/739–7398
USPC .................. 257/273, 565, 586, 592
See application file for complete search history.

(56) References Cited

U.S. PATENT DOCUMENTS

| | | |
|---|---|---|
| 5,445,976 A | 8/1995 | Henderson et al. |
| 2004/0090834 A1 | 5/2004 | Yang et al. |
| 2005/0212087 A1* | 9/2005 | Akatsu ............... H01L 29/0649 257/E29.034 |

(Continued)

*Primary Examiner* — Natalia A Gondarenko
(74) *Attorney, Agent, or Firm* — Francois Pagette; Hoffman Warnick LLC

(57) ABSTRACT

Aspects of the disclosure provide a bipolar transistor structure with a sub-collector on a substrate, a first collector region on a first portion of the sub-collector, a trench isolation (TI) on a second portion of the sub-collector and adjacent the first collector region, and a second collector region on a third portion of the sub-collector and adjacent the TI. A base on first collector region and a portion of the TI. An emitter is on a first portion of the base above the first collector region. The base includes a second portion horizontally displaced from the emitter in a first horizontal direction, and horizontally displaced from the second collector region in a second horizontal direction orthogonal to the first horizontal direction.

20 Claims, 5 Drawing Sheets

(56) References Cited

U.S. PATENT DOCUMENTS

| | | | | |
|---|---|---|---|---|
| 2008/0164494 A1* | 7/2008 | Pagette | ............... | H01L 29/0821 257/E29.174 |
| 2010/0327280 A1* | 12/2010 | Joseph | ................ | H01L 21/8249 257/E29.174 |
| 2016/0163685 A1* | 6/2016 | Jain | ..................... | H01L 29/7371 438/359 |
| 2019/0305094 A1* | 10/2019 | Tao | ..................... | H01L 29/1004 |

* cited by examiner

BIPOLAR TRANSISTOR WITH BASE HORIZONTALLY DISPLACED FROM COLLECTOR

STATEMENT REGARDING FEDERAL RIGHTS

This invention was made with government support under DARPA 45SG01 DARPA T-Music Agreement No. HR0011-20-3-0002 awarded by the United States Defense Advanced Research Project Agency (DARPA). The government has certain rights in the invention.

TECHNICAL FIELD

Embodiments of the disclosure relate generally to integrated circuit (IC) structures. More specifically, various embodiments of the disclosure provide a bipolar transistor with a base that is horizontally displaced from a collector.

BACKGROUND

In the microelectronics industry as well as in other industries involving construction of microscopic structures, there is a continued desire to reduce the size of structural features and microelectronic devices and/or to provide a greater amount of circuitry for a given chip size. One type of transistor architecture is the bipolar transistor, also known as the bipolar junction transistor (BJT). A bipolar transistor is a transistor formed of three adjacent semiconductor regions (respectively known as emitter, base, and collector) with alternating conductivity types (e.g., N-P-N or P-N-P). Conventional approaches to form a BJT on a semiconductor substrate form an extrinsic base linked to an intrinsic base (e.g., via conventional epitaxy). Such an approach generally causes portions of the collector and extrinsic base to vertically overlap. Vertical overlap between the base and collector may lead to higher base-to-collector capacitance than is not desired in certain technical applications.

SUMMARY

Aspects of the present disclosure provide a bipolar transistor structure, including: a sub-collector on a substrate; a first collector region on a first portion of the sub-collector; a trench isolation (TI) on a second portion of the sub-collector and adjacent the first collector region; a second collector region on a third portion of the sub-collector and adjacent the TI; a base on the first collector region and a portion of the TI; and an emitter on a first portion of the base above the first collector region, wherein the base includes a second portion horizontally displaced from the emitter in a first horizontal direction, and horizontally displaced from the second collector region in a second horizontal direction orthogonal to the first horizontal direction.

Further aspects of the present disclosure provide a bipolar transistor structure, including: a sub-collector on a substrate; a first collector region on a first portion of the sub-collector; a trench isolation (TI) on a second portion of the sub-collector and surrounding the first collector region; a second collector region on a third portion of the sub-collector and adjacent the TI; a third collector region on a fourth portion of the sub-collector and adjacent the TI, such that the first collector region is between the second collector region and the third collector region; a set of collector contacts to the second collector region and the third collector region; a base on first collector region and a portion of the TI; a base contact to the base; an emitter on a first portion of the base above the first collector region; and an emitter contact to the emitter, wherein the base includes a second portion horizontally displaced from the emitter in a first horizontal direction, and horizontally displaced from the second collector region in a second horizontal direction orthogonal to the first horizontal direction.

Yet another aspect of the present disclosure provides a bipolar transistor structure, including: a sub-collector on a substrate; a first collector region on a first portion of the sub-collector; a trench isolation (TI) on a second portion of the sub-collector and surrounding the first collector region; a second collector region on a third portion of the sub-collector and adjacent the TI; a base on first collector region and a portion of the TI; and an emitter on a first portion of the base above the first collector region, wherein the base includes a second portion horizontally displaced from the emitter in a first horizontal direction, and horizontally displaced from the second collector region in a second horizontal direction orthogonal to the first horizontal direction, and the TI is vertically between the sub-collector and the second portion of the base to define a capacitive coupling between the sub-collector and the second portion of the base.

BRIEF DESCRIPTION OF THE DRAWINGS

These and other features of this disclosure will be more readily understood from the detailed description of the various aspects of the disclosure taken in conjunction with the accompanying drawings that depict various embodiments of the disclosure, in which.

Figure 1:
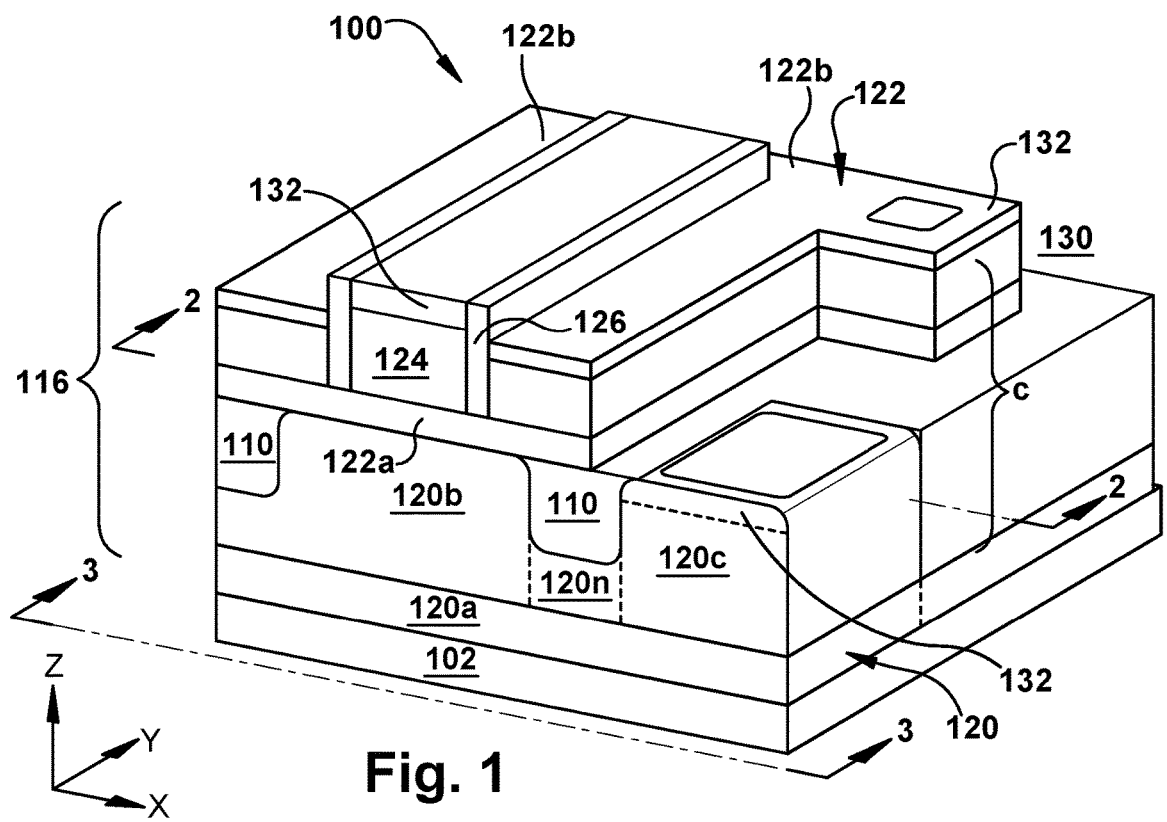
FIG. 1 provides a perspective view of a bipolar transistor according to embodiments of the disclosure.

It is noted that the drawings of the disclosure are not necessarily to scale. The drawings are intended to depict typical aspects of the disclosure, and therefore should not be considered as limiting the scope of the disclosure. In the drawings, like numbering represents like elements between the drawings.

DETAILED DESCRIPTION

In the description herein, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made within the scope of the present teachings. The description herein is, therefore, merely illustrative.

Embodiments of the disclosure provide an integrated circuit (IC) having a bipolar transistor with collectors raised above a substrate, and a base that is horizontally displaced from the collectors. The term "horizontally displaced," as used herein, refers to any two elements that have at least one other element horizontally between them, thus defining a horizontal separation between the two elements. A portion of the base of the bipolar transistor, in particular, may be horizontally displaced from the collector such that an insulator and/or inactive semiconductor material is between these two components. One or more contacts to the collector, in turn, can be horizontally displaced from the base in one direction and horizontally displaced from the emitter in a second, different direction. The horizontal displacement between base and collector may avoid vertical overlap of the base with the collector. To avoid horizontal overlap between the base and collector, the base may extend outwardly from the emitter parallel with portions of the collector beneath the collectors, with each component being located in different two-dimensional planes. Among other things, this configuration causes a transistor to occupy less area and volume in a structure, while allowing it to perform the same functions as conventional transistor structures. In particular, the width of the transistor is reduced by including only the emitter the base along a first horizontal direction, while the length of the transistor is substantially maintained (or also reduced) by aligning the base contact and collector contacts along the length, or other axis different from the width.

The bipolar transistor may include a bipolar junction transistor (BJT) stack configured to include, e.g., a NPN, PNP, heterojunction (HBT) NPN, or HBT PNP configuration. The structure may include a sub-collector on a substrate. A first collector region is on a first portion of the sub-collector, and a second collector region is on another portion of the sub-collector. A trench isolation is on a portion of the sub-collector between the two collector regions, thus separating the second collector region from the first collector region. A base is on the first collector region and a portion of the TI. An emitter is on the base, and part of the base extends horizontally away from the emitter in a first horizontal direction. Thus, a portion of the base is horizontally displaced from the second collector region in a horizontal direction that is orthogonal to a horizontal separation between the second collector region and the emitter. Contacts to the base similarly may be horizontally displaced from any contacts to the second collector region along one horizontal axis, and horizontally displaced from any contacts to the emitter along an orthogonal horizontal axis. Thus, the contacted base may be both horizontally and vertically separated from the collector to avoid any overlap between these two portions of the bipolar transistor. Embodiments of the disclosure thus offer lower base-to-collector capacitance in contrast to conventional bipolar transistors, in which portions of the base will vertically overlap the collector.

Bipolar transistors, such as those in embodiments of the disclosure, include multiple "P-N junctions." The term "P-N" refers to two adjacent materials having different types of conductivity (i.e., P-type and N-type), which may be induced through dopants within the adjacent material(s). A P-N junction, when formed in a device, may operate as a diode. A diode is a two-terminal element, which behaves differently from conductive or insulator materials between two points of electrical contact. Specifically, a diode provides high conductivity from one contact to the other in one voltage bias direction (i.e., the "forward" direction), but provides little to no conductivity in the opposite direction (i.e., the "reverse" direction). In the case of a junction between two semiconductor materials, the potential barrier will be formed along the interface between the two semiconductor materials. IC structures according to the disclosure include a base that is horizontally displaced from the emitter and a collector along respective orthogonal axes, thus avoiding overlap between the second portion of the base and the collector. In some implementations, portions of the collector and base may extend horizontally away from the emitter in parallel with each other. These structural characteristics may provide, among other things, improved operational reliability, and reduced capacitance between the base and collector terminals of the bipolar transistor.

Figure 2:
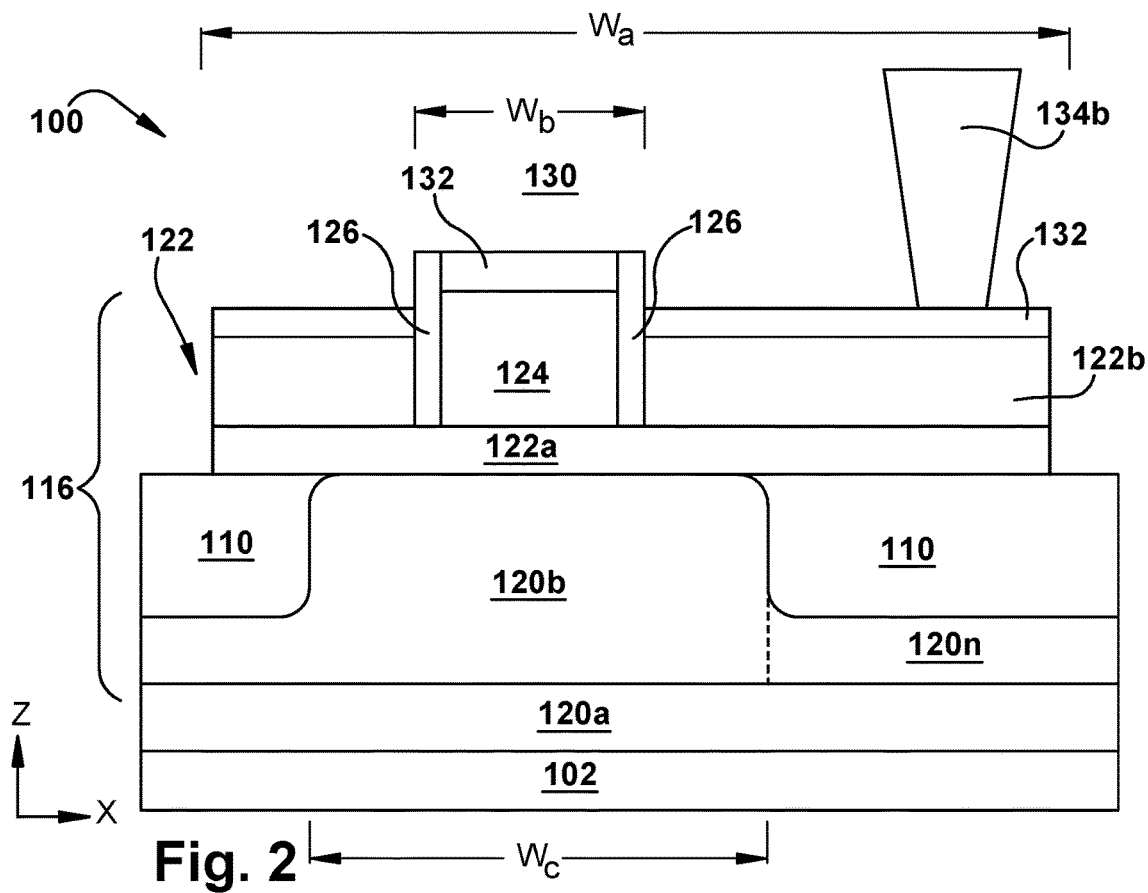
FIG. 2 provides a cross-sectional view, viewed along line 2-2 of FIG. 1, of a bipolar transistor according to embodiments of the disclosure.
Figure 3:
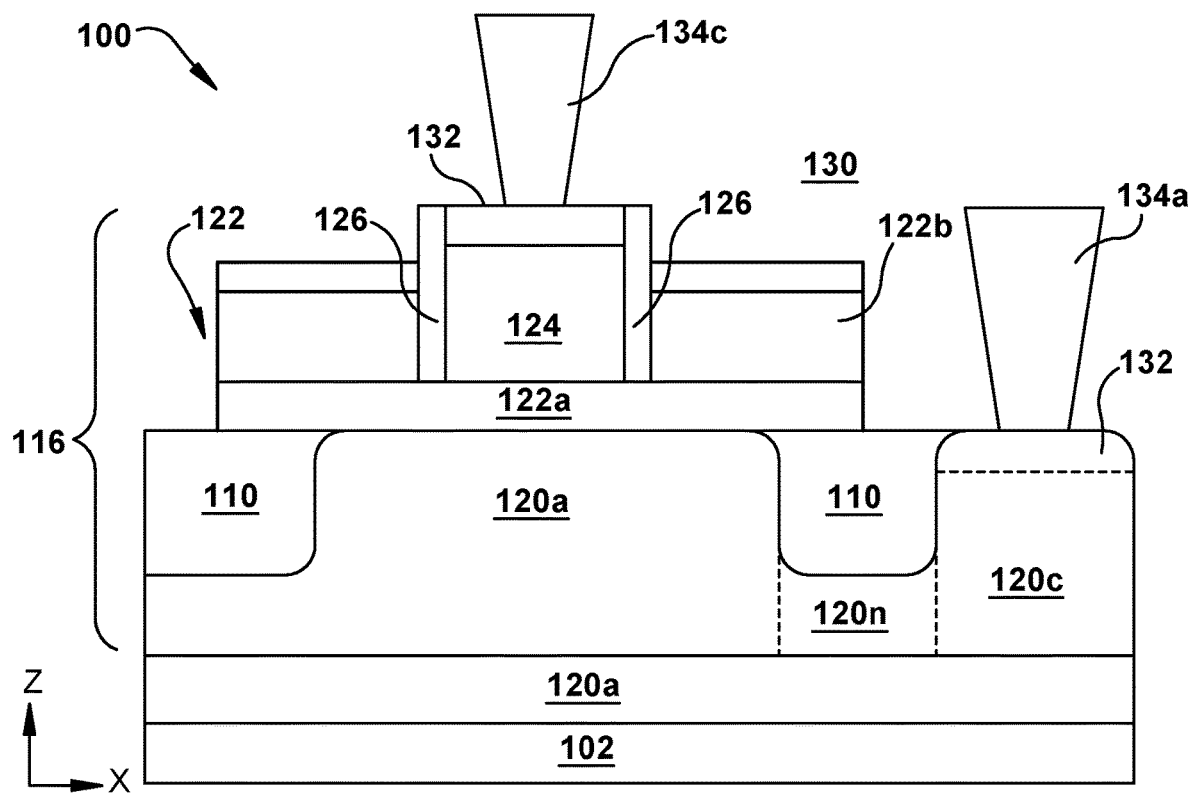
FIG. 3 provides another cross-sectional view, viewed along line 3-3 of FIG. 1, of a bipolar transistor according to embodiments of the disclosure.

Referring to FIGS. 1-3, a bipolar transistor 100 (simply "transistor" hereafter) according to embodiments of the disclosure is shown. FIG. 1 provides a perspective view of transistor 100, while FIGS. 2 and 3 depict cross-sectional views of transistor 100, viewed from the perspective indicated through view lines 2-2 and 3-3 of FIG. 1, respectively. Transistor 100 may be formed on a substrate 102 including, e.g., one or more semiconductor materials. Substrate 102 may include but is not limited to silicon, germanium, silicon germanium, silicon carbide, or any other common IC semiconductor substrates. A portion or entire semiconductor substrate 102 may be strained. Additionally, various conductive particles ("dopants") may be introduced into substrate 102 via a process known as "pre-doping" of substrate 102.

Embodiments of the disclosure may include a set of trench isolations (TIs) 110, formed by forming and filling trenches (not shown) with an insulating material such as oxide, to isolate various portions of substrate 102 from other portions of substrate 102. Various portions of an IC structure, including the active semiconductor materials of transistor 100 and/or other devices formed on substrate 102, may be disposed within an area of substrate 102 that is isolated by TI(s) 110. According to one example, two areas of TI 110 material are shown, but these areas may in fact be portions of a single, larger region of TI 110 material and/or groups of larger TI 110 regions, with one portion of substrate 102 being horizontally between the two illustrated areas of TI 110. Portions of substrate 102, and materials formed thereon, may define the various terminals and components of transistor 100. Various portions of substrate 102 may be doped and/or otherwise processed to form a conductive coupling to one terminal of transistor 100. TIs 110 may be formed before active materials are formed within substrate 102, but this is not necessarily true in all implementations. Each TI 110 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Selected portions of substrate 102 may be doped to define various active components of transistor 100. Such portions of substrate 102 may be alongside and underneath TI(s) 110 to provide a pathway to other doped semiconductor materials. The doping of substrate 102 may be P-type or N-type in a relatively low concentration, compared to other doped regions and/or materials of transistor 100 (e.g., BJT stack 116), discussed herein. P-type dopants refer to elements introduced into substrate 102 to generate free holes by "accepting" electrons from a semiconductor atom and consequently "releasing" the hole. The acceptor atom must have one valence electron less than the host semiconductor. P-type dopants suitable for use in substrate 102 may include but are not limited to: boron (B), indium (In) and gallium (Ga). Boron (B) is the most common acceptor in silicon technology. Further alternatives include indium and gallium (Ga). Gallium (Ga) features high diffusivity in silicon dioxide ($SiO_2$), and hence, the oxide cannot be used as a mask during Ga diffusion. N-type dopants are elements introduced into semiconductor materials to generate free electrons, e.g., by "donating" an electron to the semiconductor. N-type dopants must have one more valance electrons than the semiconductor. Common N-type donors in silicon (Si) include, e.g., phosphorous (P), arsenic (As), and/or antimony (Sb).

Various additional doped semiconductor materials may be formed on substrate 102, thus defining active regions of transistor 100. Specifically, transistor 100 includes a BJT stack 116 of semiconductor materials over substrate 102. BJT stack 116 may include the same material and/or similar materials as substrate 102 thereunder, and/or may include silicon germanium (SiGe), or one or more compound semiconductor materials (e.g., gallium arsenide (GaAs), aluminum gallium arsenide (AlGaAs), silicon carbide (SiC), gallium nitride (GaN), and/or other compound materials with similar properties). Each of these various semiconductor or compound semiconductor materials may be formed as a single layer or film.

BJT stack 116 may include a collector 120, which may be doped N-type or P-type and in some cases may have the same polarity as doped portions of substrate 102 thereunder. Collector 120 may have different dopants and/or doping concentrations compared to substrate 102, and may be doped in situ during its deposition and growth, where applicable. Collector 120 may be subdivided into several portions, distinguishable from each other based on their position relative to TI(s) 110 and/or other components discussed herein. Otherwise, each portion of collector 120 may be compositionally or structurally indistinct, and/or may have a substantially uniform concentration of dopants and/or a single doping polarity. As used herein, a "substantially uniform" doping concentration refers to a structure in which no portion of the structure has a doping concentration that differs from the doping concentration in another portion of the structure by more than, e.g., approximately ten percent. In other implementations, the threshold percentage for uniformity may be less than approximately ten percent. Collector 120 may include a sub-collector 120a on an upper surface of substrate 102, thus defining a physical interface between substrate 102 and collector 120. Collector 120 additionally may include, e.g., a first collector region 120b adjacent TI(s) 110 and underneath a portion of a base 122 of transistor 100. The term "collector region," as used herein, may refer to a layer, portion, or other area of doped semiconductor material located on an upper surface sub-collector 120a, and perhaps structurally integrated with portions of sub-collector 120a thereunder. First collector region 120b and similar collector regions may be distinguished from sub-collector 120a solely by their position on sub-collector 120a, and not by physical interfaces and/or differences between the two components.

As discussed elsewhere herein, base 122 may include semiconductor material with opposite doping from collector 120. Base 122 may be on only first collector region 120b and adjacent portions of TI(s) 110, with other portions of collector 120 not having a junction with base 122. A second collector region 120c (FIGS. 1 and 3 only) of collector 120 may also be on sub-collector 120a and adjacent TI(s) 110, but may be horizontally displaced from first collector region 120b. Second collector region 120c may be connected to first collector region 120b through an intermediate portion 120n (FIGS. 1 and 3 only) located, e.g., at least partially beneath TI(s) 110 (e.g., as shown in FIGS. 1 and 3). Sub-collector 120a and/or collectors 120b, 120c may be formed, e.g., by epitaxial growth of each semiconductor material over substrate 102, and/or by other methods including in situ doping or via tailored implantation, hybrids of epitaxial growth and/or implantation, and/or further doping techniques. Such processes may produce sub-collector 120a as a layer of doped semiconductor material, with collectors 120b, 120c being formed thereover by epitaxial growth and/or removing selected portions of semiconductor material, followed by tailored implanting of dopants.

Transistor 100 may include base 122 on first collector region 120b of collector 120. Similar to collector 120, base 122 may be formed of SiGe, compound semiconductor materials, etc., and may have an opposite doping type with respect to collector 120, e.g., by being P-type when collector 120 is N-type, or vice versa. In further implementations, base 122 may include any currently known or later developed compound semiconductor material, e.g., GaAs, AlGaAs, SiC, GaN, etc. Base 122 may have a horizontal width (WB in FIG. 2) that is greater than a horizontal width (Wc in FIG. 2) of first collector region 120b of collector 120 thereunder, e.g., due to being formed partially on TI(s) 110 adjacent first collector region 120b. Base 122 itself may be subdivided into a first portion 122a and a second portion 122b. First portion 122a of base 122 and second portion 122b of base 122 may have the same doping polarity, but different doping concentrations. First portion 122a may include, and/or in some cases may be embodied as, an intrinsic base having a lower doping concentration than second portion 122b, to more easily control the flow of current from collector 120 to an emitter 124 formed on first portion 122a. In this case, emitter 124 may be located above only first portion 122a, and thus second portion 122b may have a higher doping concentration than first portion 122a. Although two portions of second portion 122b are shown on opposite sides of emitter 124, it is understood that base 122 wraps around an entirety of emitter 124.

The higher doping concentration in second portion 122b may increase electrical conductivity between base 122 and any contacts coupled to base 122 for controlling the flow of current through BJT stack 116. As shown, second portion 122b may be vertically above sub-collector 120a, with portions of TI 110 vertically separating sub-collector 120a from second portion 122b. In this case, a capacitive coupling C may be defined across TI 110, and the size of the vertical separation may be controlled to provide a desired collector-base capacitance for particular applications. In further implementations discussed herein, capacitive coupling C may be eliminated via structural modifications. Despite any differences in the doping concentration at different portions thereof, base 122 may have the same material composition as other layers and/or materials in BJT stack 116, and thus may include SiGe.

An emitter 124 may be on first portion of base 122a, and may have the same doping type as collector 120. In this position, transmitting a current to base 122 may control whether current is capable of flowing from collector 120 to emitter 124. Emitter 124 thus may include any material capable of being included within collector 120 and/or other semiconductor materials, e.g., SiGe, compound semiconductor materials, and/or other materials with similar properties. Emitter 124 may be doped to any desired concentration. In some cases, emitter 124 may have a similar doping concentration as collector 120. In BJT stack 116, collector 120, base 122, and emitter 124 form alternating P-N junctions because of their arrangement and doping, and thus define the three active terminals of transistor 100. The doping types and concentrations of collector 120, base 122, and/or emitter 124 of BJT stack 114 may be controlled, e.g., by epitaxial and/or by other methods including in situ doping or via implantation, hybrids of epitaxial growth and/or implantation, and/or further doping techniques as described herein.

BJT stack 116 may be located alongside and/or within insulator materials. A set of spacers 126 may be on sidewalls of emitter 124. Spacers may be formed of a nitride insulator and/or other insulator materials described elsewhere herein with respect to TI(s) 110 and/or other insulator materials. Spacer(s) 126, once formed, electrically separate emitter 124 from other materials formed on base 122. An inter-level dielectric (ILD) layer 130 may be above substrate 102; including TI(s) 110, and BJT stack 116. ILD layer 130 may include the same insulating material as TI(s) 110, or may include a different electrically insulating material. ILD layer 130 and TI(s) 110 nonetheless constitute different components, e.g., due to TI(s) 110 being formed within portions of substrate 102 instead of being formed thereon. ILD layer 130 can separate substrate 102 and transistor 100 formed thereon from various overlying layers. Such layers may include, e.g., metal level layers for interconnecting transistor 100 with other devices on substrate 102 and/or other active components of a device.

Various portions of transistor 100, e.g., second collector region 120c of collector 120, second portion 122b of base 122, and/or emitter 124, may include a silicide layer 132 for coupling of active semiconductor material to conductive material(s) thereon. Silicide layer 132 as known in the art could be formed on the exposed surfaces of collector 120, base 122, and/or emitter 124 before ILD layer 130 deposition. For example, a cobalt (Co), titanium (Ti), nickel (Ni), platinum (Pt), or similar self-aligned silicide (salicide) could be formed before ILD layer 130 deposition. Additional metallization layers (not shown) may be formed on ILD layer 130 during middle-of-line and/or back-end-of-line processing.

To electrically couple various components discussed herein to such metallization layers, a collector contact 134a (FIG. 3 only) may be formed within ILD 130 to second collector region 120c of collector 120, e.g., at silicide layer 132. Similarly, one or more base contacts 134b (FIG. 2 only) may be formed within ILD 130 for coupling to second portion 122b of base 122 and/or silicide layer(s) 132 therein. An emitter contact 134c (FIG. 3 only) within ILD 130 can be formed to emitter 124, e.g., on silicide layer(s) 132 of emitter 124. Each contact 134a, 134b, 134c may include any currently known or later developed conductive material configured for use in an electrical contact, e.g., copper (Cu), aluminum (Al), gold (Au), etc. Contacts 134a, 134b, 134c may additionally include refractory metal liners (not shown) positioned alongside ILD layer 130 to prevent electromigration degradation, shorting to other components, etc.

Figure 4:
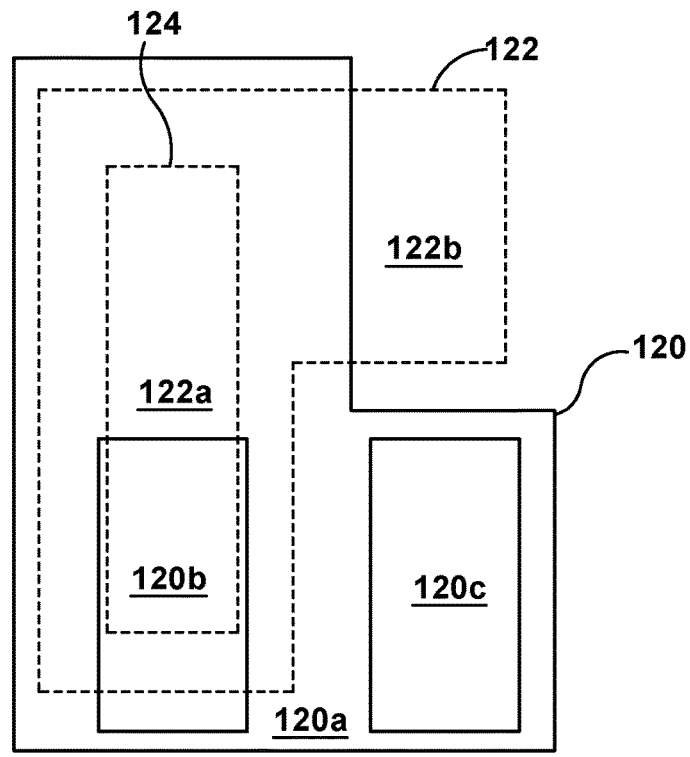
FIG. 4 provides a plan view of a collector in a transistor according to embodiments of the disclosure.

Referring to FIGS. 1 and 4, embodiments of transistor 100 may position collector 120 and base 122 in a manner that is structurally distinct from conventional bipolar transistors formed on or within semiconductor material (e.g., substrate 102). FIG. 4 illustrates a plan view of collector 120 including sub-collector 120a, first collector region 120b, and second collector 120c to show their respective positions. Base 122, emitter 124, and portions thereof are shown in dashed lines to illustrate their position in overlying planes. As shown generally in FIGS. 1 and 4, second collector region 120c of collector 120 and second portion 122b of base 122 may be horizontally displaced along a first direction (e.g., along the Y-axis). Thus, second portion 122b may not vertically overlap second collector region 120c due to their relative horizontal positions (e.g., on the Y-axis). Second collector region 120c additionally may be horizontally displaced from emitter 124 along a second direction that is orthogonal to the first direction (e.g., along the X-axis). The physical separation of second collector region 120c from second portion 122b of base 122, and emitter 124, may reduce parasitic capacitance in transistor 100 due to the inability for current to pass horizontally and vertically from second collector region 120c to base 122 and/or emitter 124 directly through TI(s) 110. Moreover, embodiments of the disclosure occupy less area or volume than conventional bipolar transistors, by aligning emitter 124 and second collector region 120c in a horizontal direction (e.g., along X-axis) that is orthogonal to the alignment between second collector region 120c and second portion 122b of base 122.

Figure 5:
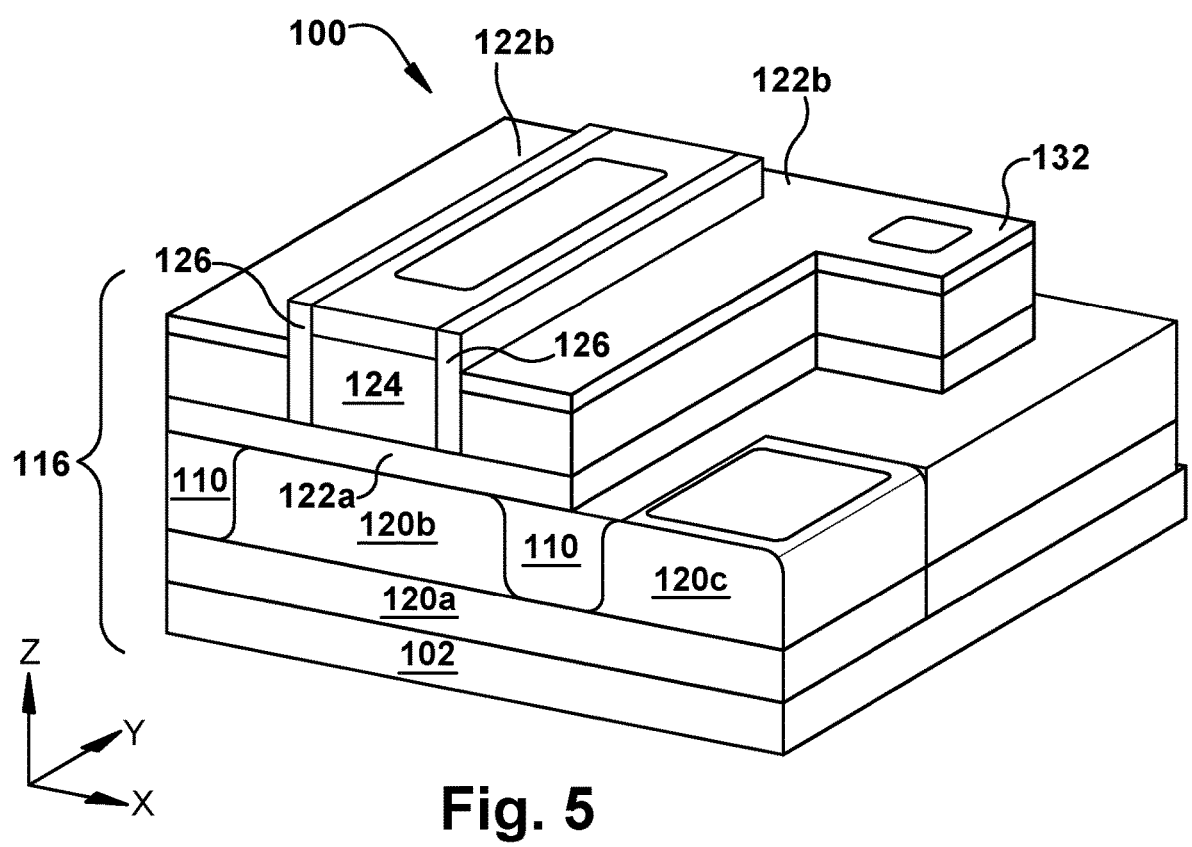
FIG. 5 provides a perspective view of a bipolar transistor without a capacitive coupling according to further embodiments of the disclosure.

Referring to FIG. 5 embodiments of transistor 100 may include further physical and electrical characteristics for controlling base-to-collector capacitance, retaining a desired device area and operational reliability. FIG. 5 depicts a perspective view with second portion 122b of base 122 being horizontally displaced from second collector region 120c, while also being over substrate 102 without being above sub-collector 120a. In this example configuration, second portion 122b of base 122 protrudes horizontally away from emitter 124, and substantially in parallel with second collector region 120c. Thus, base 122 remains horizontally displaced from second collector region 120c in embodiments of transistor 100.

During operation, transistor 100 in some implementations may accommodate electric current from collector 120 to emitter 124 of greater magnitude than the amount of current delivered to base 122. To account for these current levels, collector contact 134a is shown to have a substantially larger physical interface (indicated, e.g., by surface area in plane X-Y) than the interface between base contact 134b to base 122. To allow this difference in size, second collector region 120c may occupy a larger surface area in plane X-Y than the surface area of base 122, where it connects to base contact 134b.

The position of TI(s) 110 in transistor 100 in some implementations may prevent capacitive coupling C (FIG. 1) from being formed within transistor 100. In this case, second portion 122b of base 122 may be located above a space where TI 110 is formed within sub-collector 120a, and thus second portion 122b is not vertically above any portion of collector 120. Here, the increased vertical thickness of TI 110 will prevent a capacitive coupling (and hence, base-collector capacitance) from being formed within transistor 100. In all other respects, however, transistor 100 may include the same or similar structural attributes described herein relative to other implementations. That is, second portion 122b of base 122 (and base contact 134b thereto) may be horizontally separated from first collector region 120b in one direction, and horizontally separated from emitter 124 in a second direction orthogonal to the first direction (e.g., X and Y axes as shown). Moreover, second portion 122b of base 122 may not vertically overlap second collector region 120c of collector 120, even with an increased thickness of TI(s) 110 below second portion 122b of base 122.

Figure 6:
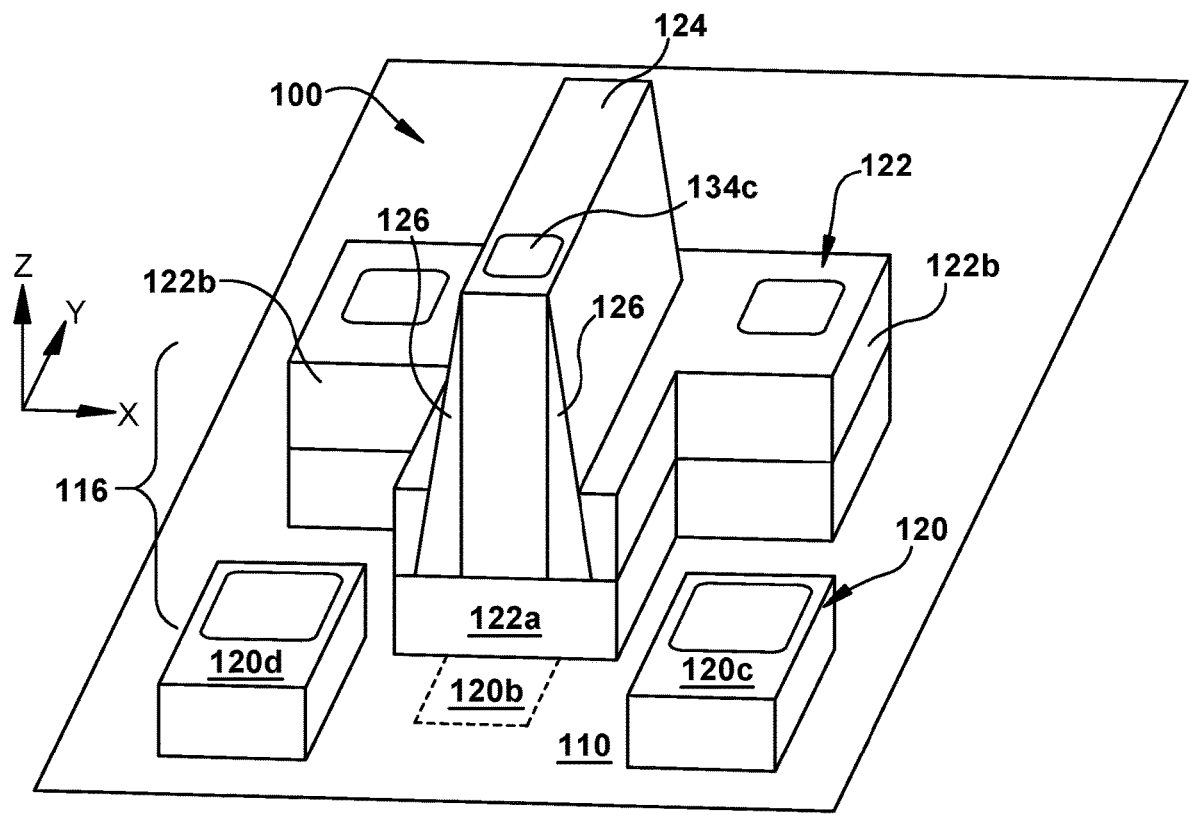
FIG. 6 provides a perspective view of a bipolar transistor according to further embodiments of the disclosure.
Figure 7:
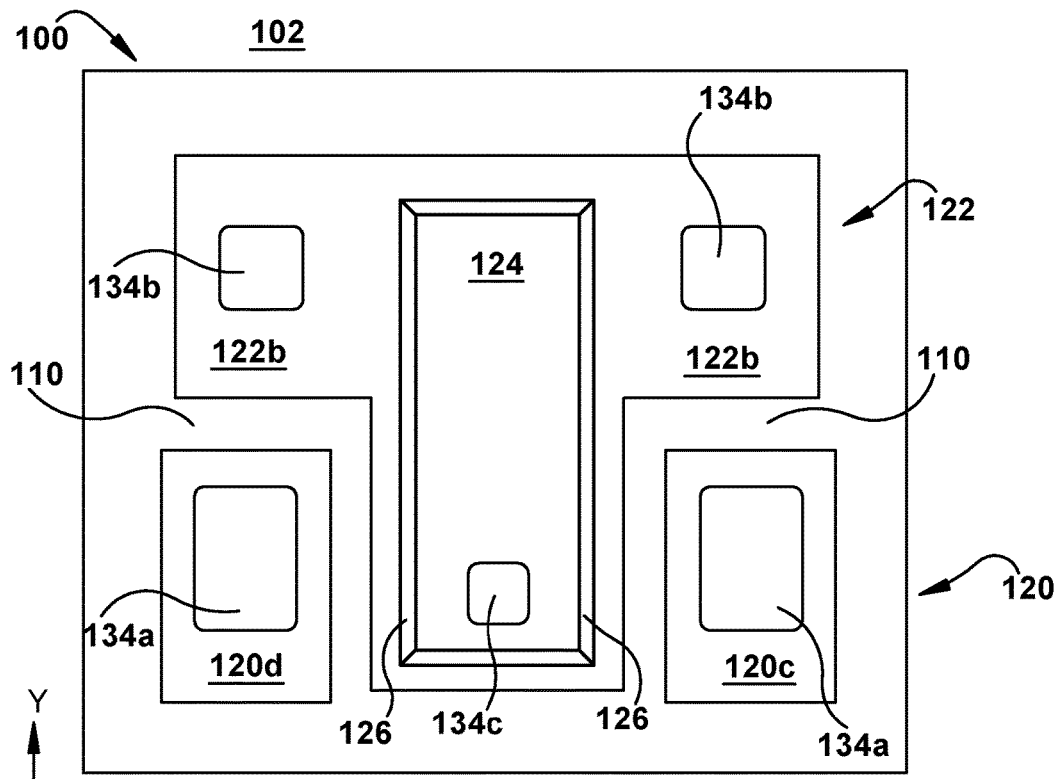
FIG. 7 provides a plan view of a bipolar transistor according to further embodiments of the disclosure.

FIGS. 6 and 7 depict perspective and plan views, respectively, of an alternative implementation of transistor 100 with multiple collector contacts 134a (FIG. 6) and base contacts 134b (FIG. 7). In some implementations, collector 120 may include a third collector region 120d adjacent first collector region 120b, protruding in opposition to (e.g., along X-axis in the opposite direction) second collector region 120c. Here, first collector region 120b of collector 120 is horizontally between second collector region 120c and third collector region 120d. Each of collectors 120c, 120d may be horizontally displaced from second portion 122b of base 122, such that second portion 122b vertically overlaps neither second collector region 120c nor third collector region 120d. In this case, transistor 100 may include multiple collector contacts 134a to second collector region 120c and third collector region 120d of collector 120, respectively. In a similar configuration, second portion 122b of base 122 may include several protrusions extending horizontally from emitter 124 in opposition to each other, and two base contacts 134b each may be coupled to second portion 122b on one of the two protruding areas. Each collector contact 134a, individually or collectively, may occupy a larger X-Y surface area than base contacts 134b to second portion 122b. Portions of TI 110 may be horizontally between second collector region 120c or third collector region 120d, and second portion 122b. Thus, second portion 122b of base 122 may not vertically overlap any portion of second collector region 120c or third collector region 120d.

Figure 8:
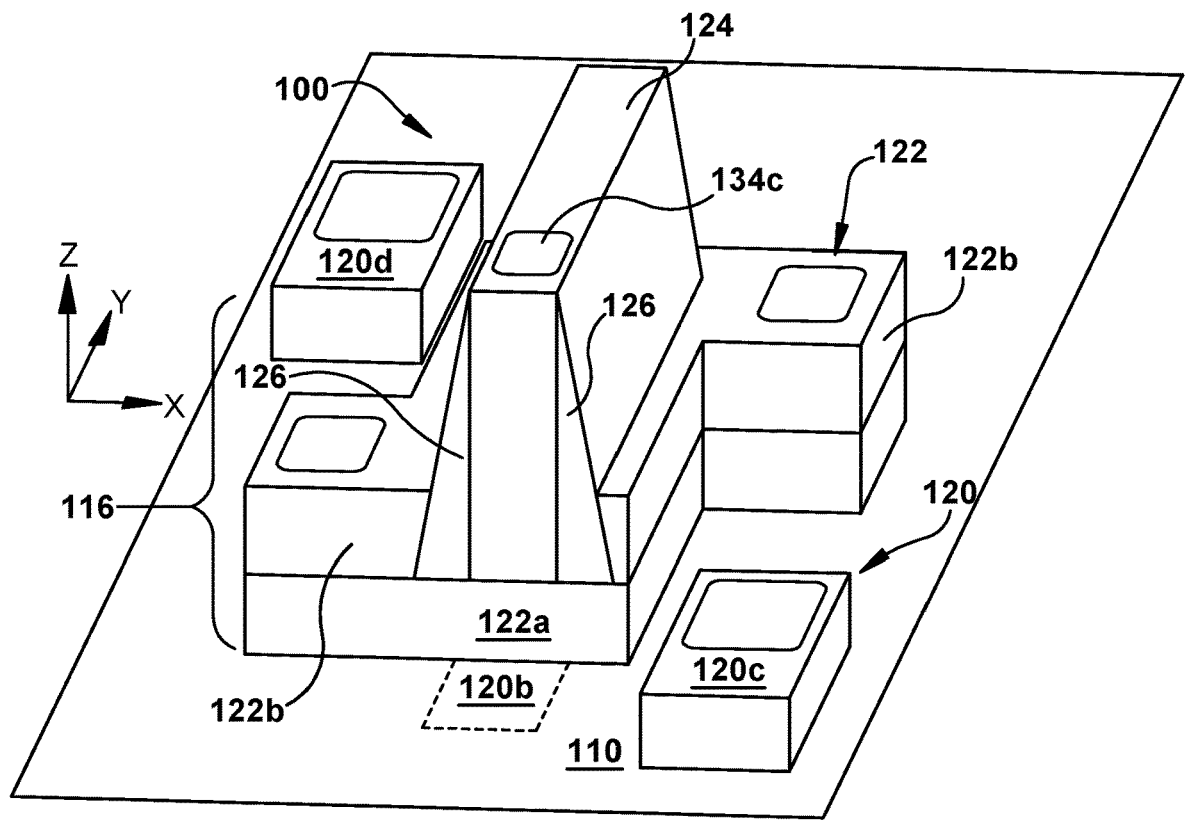
FIG. 8 vides a perspective view of a bipolar transistor according to additional embodiments of the disclosure.
Figure 9:
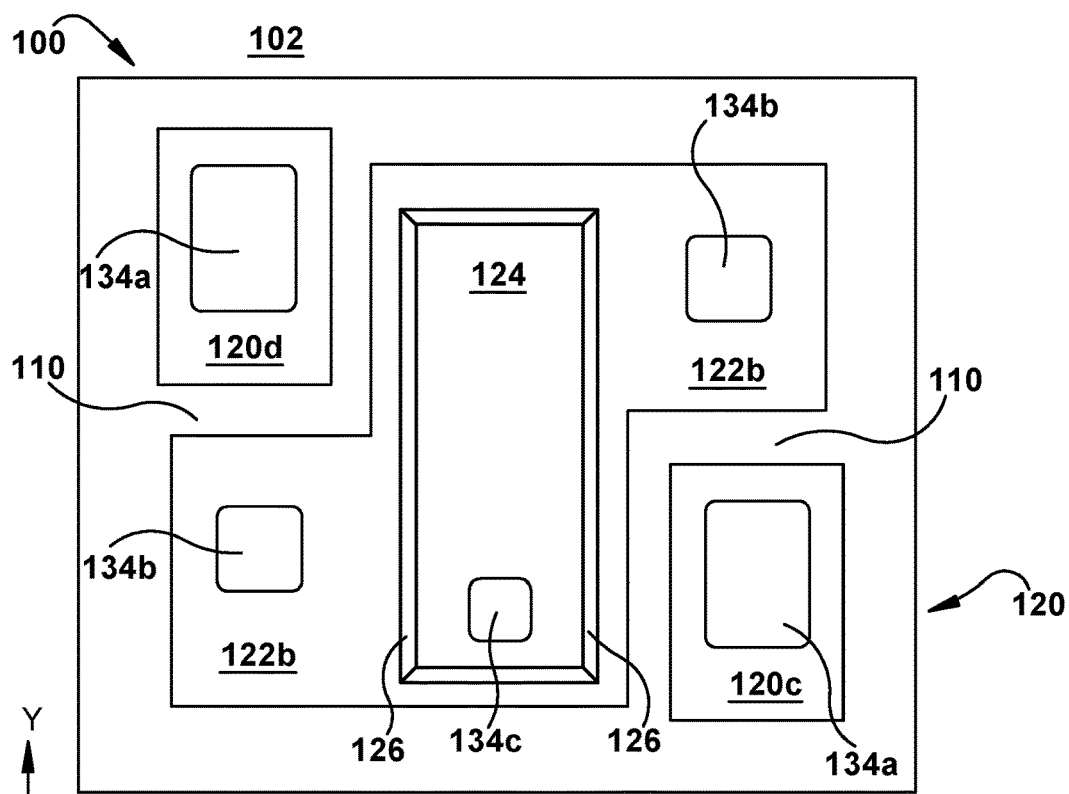
FIG. 9 provides a plan view of a bipolar transistor according to additional embodiments of the disclosure.

FIGS. 8 and 9 depict additional implementations of a further alternative implementation of transistor 100, in which second collector region 120c and third collector region 120d extend horizontally in parallel, and are not horizontally aligned with each other (e.g., on either the X-axis or Y-axis in plane X-Y). FIG. 8 depicts transistor 100 with a perspective view, while FIG. 9 depicts a plan view of transistor 100. In such implementations, first collector region 120b may be located underneath first portion 122a of base 122, with second collector region 120c and third collector region 120d of collector 120 protruding horizontally from first collector region 120b in opposite directions. However, second collector region 120c and third collector region 120d may not be in substantial alignment with each other, e.g., by extending horizontally from different lengthwise ends of first collector region 120b. In this configuration, second portion 122b of base 122 may protrude horizontally from first portion 122a at a location that is opposite second collector region 120c, and from first portion 122a at another location that is opposite third collector region 120d.

Thus, as shown in the X-Y orientation of FIG. 9, second collector region 120c may be diagonally opposite third collector region 120d in plane X-Y (e.g., lower right to upper left), while two areas of second portion 122b may be diagonally opposite each other (e.g., lower left to upper right). In implementations where transistor 100 has a different X-Y orientation, second collector region 120c and third collector region 120d may be opposite each other on one axis, while two areas of second portion 122b may be opposite each other in an orthogonal axis, thus defining a cross shape or similar arrangement. In this configuration, however, second portion 122b of base 122 may not vertically overlap second collector region 120c or third collector region 120d of collector 120. Portions of TI(s) 110 are horizontally between second portion 122b of base 122 and second collector region 120c or third collector region 120d of collector 120. Thus, base contact 134b still may not overlap second collector region 120c or third collector region 120d when multiple collectors (e.g., second collector region 120c, third collector region 120d) are included.

Embodiments of the disclosure provide various technical and commercial advantages. Some advantages of the disclosure may include, e.g., providing a bipolar transistor structure with lower base-to-collector capacitance, while providing much smaller horizontal surface area as other bipolar transistor devices. Embodiments of the disclosure allow bipolar transistors to be implemented with better operational reliability, while occupying substantially less space versus conventional bipolar transistors. Without any cognizable sacrifices to operability and behavior, bipolar transistors according to embodiments of the disclosure will occupy less area and less volume on a product while continuing to perform the same functions as other bipolar transistors. The reductions in area and volume arise from aligning the base and collector contacts to the transistor in a direction orthogonal to the alignment between the collector and emitter contacts. In this arrangement, the transistor has a smaller width in one horizontal direction while having substantially the same length in another horizontal direction orthogonal to the width. These attributes can allow to related device improvements such as, e.g., smaller chip size, higher device densities, scaling advantages, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A bipolar transistor structure, comprising:
a sub-collector on a substrate;
a first collector region on a first portion of the sub-collector;
a trench isolation (TI) on a second portion of the sub-collector and adjacent the first collector region;
a second collector region on a third portion of the sub-collector and adjacent the TI, wherein an upper surface of the second collector region is substantially coplanar with an uppermost surface of the first collector region;
a base on the first collector region and a portion of the TI; and
an emitter on a first portion of the base above the first collector region,
wherein the base includes a second portion laterally protruding from the first portion of the base and horizontally distal to each the sub-collector and the second collector region.

2. The bipolar transistor structure of claim 1, further comprising a collector contact to the second collector region and a base contact to the second portion of the base, wherein an interface between the second collector region and the collector contact is larger than an interface between the second portion of the base and the base contact.

3. The bipolar transistor structure claim 1, wherein the TI extends vertically between the substrate and the second portion of the base.

4. The bipolar transistor structure of claim 1, wherein the second portion of the base protrudes horizontally away from the emitter along the first horizontal direction.

5. The bipolar transistor structure of claim 1, further comprising a spacer horizontally between the second portion of the base and the emitter.

6. The bipolar transistor structure of claim 1, wherein the second portion of the base does not vertically overlap the second collector region.

7. A bipolar transistor structure, comprising:
a sub-collector on a substrate;
a first collector region on a first portion of the sub-collector;
a trench isolation (TI) on a second portion of the sub-collector and surrounding the first collector region;
a second collector region on a third portion of the sub-collector and adjacent the TI;
a third collector region on a fourth portion of the sub-collector and adjacent the TI;
a set of collector contacts to the second collector region and the third collector region;
a base on the first collector region and a portion of the TI;
a base contact to the base;
an emitter on a first portion of the base above the first collector region; and
an emitter contact to the emitter,
wherein the base includes a second portion laterally protruding from the first portion of the base and horizontally distal to each the sub-collector and the second collector region.

8. The bipolar transistor structure of claim 7, wherein an interface between the second collector region and a collector contact from the set of collector contacts is larger than an interface between the second portion of the base and the base contact.

9. The bipolar transistor structure of claim 7, wherein the TI extends vertically between the substrate and the second portion of the base.

10. The bipolar transistor structure of claim 7, further comprising a spacer horizontally between the first portion of the base and the emitter.

11. The bipolar transistor structure of claim 7, wherein the second portion of the base does not vertically overlap one of the second collector region and the third collector region.

12. A bipolar transistor structure, comprising:
a sub-collector on a substrate;
a first collector region on a first portion of the sub-collector;
a trench isolation (TI) on a second portion of the sub-collector and surrounding the first collector region;
a second collector region on a third portion of the sub-collector and adjacent the TI;
a base on the first collector region and a first portion of the TI; and
an emitter on a first portion of the base above the first collector region,
wherein the base includes a second portion laterally protruding from the first portion of the base and horizontally distal to each the sub-collector and the second collector region, and
wherein the TI includes a second portion thicker than the first portion of the TI, the second portion vertically between the sub-collector and the second portion of the base, the second TI portion at least partially directly beneath the second portion of the base.

13. The bipolar transistor structure of claim 12, further comprising a collector contact to the second collector region and a base contact to the second portion of the base, wherein an interface between the second collector region and the collector contact is larger than an interface between the second portion of the base and the base contact.

14. The bipolar transistor structure of claim 12, wherein the second portion of the base protrudes horizontally away from the emitter along the first horizontal direction.

15. The bipolar transistor structure of claim 13, wherein the second portion of the base does not vertically overlap the second collector region.

16. The bipolar transistor structure of claim 1, further including a silicide layer, the silicide layer including a first portion over the emitter and a second portion over the second portion of the base.

17. The bipolar transistor structure of claim 7, further including a silicide layer, the silicide layer including a first portion over the emitter and a second portion over the second portion of the base.

18. The bipolar transistor structure of claim 7, wherein the base further includes a third portion laterally protruding from the first portion and horizontally distal to each the sub-collector and the second collector region.

19. The bipolar transistor structure of claim 1, wherein the second base portion is oriented substantially in parallel with the second collector region.

20. The bipolar transistor structure of claim 12, wherein the second base portion is oriented substantially in parallel with the second collector region.

\* \* \* \* \*

UNITED STATES PATENT AND TRADEMARK OFFICE
CERTIFICATE OF CORRECTION

| | |
|---|---|
| PATENT NO. | : 11,728,380 B2 |
| APPLICATION NO. | : 17/356633 |
| DATED | : August 15, 2023 |
| INVENTOR(S) | : Viorel C. Ontalus |

It is certified that error appears in the above-identified patent and that said Letters Patent is hereby corrected as shown below:

In the Specification

In Column 2, Line 48 reads "FIG. 8 vides a perspective view of the bipolar transistor...", but it should read "FIG. 8 provides a perspective view of the bipolar transistor..."

Signed and Sealed this
Nineteenth Day of September, 2023

Katherine Kelly Vidal
*Director of the United States Patent and Trademark Office*